(12) United States Patent
Streibl et al.

(10) Patent No.: US 7,461,186 B2
(45) Date of Patent: Dec. 2, 2008

(54) DATA HANDOVER UNIT FOR TRANSFERRING DATA BETWEEN DIFFERENT CLOCK DOMAINS BY PARALLELLY READING OUT DATA BITS FROM A PLURALITY OF STORAGE ELEMENTS

(75) Inventors: Martin Streibl, Petershausen (DE); Peter Gregorius, Munich (DE); Ralf Schledz, Zolling (DE); Thomas Rickes, Munich (DE); Zheng Gu, Hoehenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 300 days.

(21) Appl. No.: 11/346,993

(22) Filed: Feb. 3, 2006

(65) Prior Publication Data

US 2007/0186124 A1  Aug. 9, 2007

(51) Int. Cl.
*G06F 13/38* (2006.01)
*G06F 11/00* (2006.01)

(52) U.S. Cl. .................. 710/58; 710/3; 710/29; 710/33; 710/38; 710/51; 710/55; 710/62; 714/28; 714/37; 714/39; 713/400

(58) Field of Classification Search .............. 710/3, 710/29, 33, 38, 51, 55, 58, 62; 714/28, 27, 714/39; 713/400
See application file for complete search history.

(56) References Cited

U.S. PATENT DOCUMENTS

| | | | | |
|---|---|---|---|---|
| 5,204,676 A | * | 4/1993 | Herrmann | 341/61 |
| 5,887,196 A | * | 3/1999 | Roskowski et al. | 710/51 |
| 5,892,897 A | * | 4/1999 | Carlson et al. | 714/37 |
| 7,058,855 B2 | * | 6/2006 | Rohfleisch et al. | 714/28 |
| 2005/0081113 A1 | * | 4/2005 | Beard et al. | 714/39 |

* cited by examiner

*Primary Examiner*—Tammara R Peyton
(74) *Attorney, Agent, or Firm*—Patterson & Sheridan, L.L.P.

(57) ABSTRACT

The invention provides a data handover unit for transferring data from a furst clock domain to a second clock domain, comprising: a first clock unit operable to supply a first clock signal; a selector stage operable to sample an incoming data stream with respect to the first clock signal; a second clock unit operable to supply a second clock signal; a storage unit coupled with the selector stage, wherein the storage unit has a first plurality of storage elements each of which is operable to store one bit of data of the sampled data stream, an output unit for parallelly reading out a fram of data from a second plurality of storage elements included in the first plurality of storage elements with respect to the second clock signal, wherein the selector stage is further operable to successively write the data bits of the sampled data stream into the first plurality of storage elements and to store the respective data bits of the sampled data stream in the respective storage elements until they were read out by the output unit.

30 Claims, 5 Drawing Sheets

DATA HANDOVER UNIT FOR TRANSFERRING DATA BETWEEN DIFFERENT CLOCK DOMAINS BY PARALLELLY READING OUT DATA BITS FROM A PLURALITY OF STORAGE ELEMENTS

BACKGROUND OF THE INVENTION

1. Field of the Invention

The present invention is related to a data handover unit for transferring data between different clock domains, particularly between clock domains having different clock frequencies. The present invention is further related to a method for operating a data handover unit.

2. Description of the Related Art

In high-speed data devices, incoming high-speed data have to be securely handed over from a high-speed receiver to a protocol layer of a high-speed serial link. Usually, the clock domain of the incoming high-speed data and the clock domain of the protocol layer are different in frequency/data rate, in a worst case by a non-even or a non-integer multiplication factor. In a standard approach, a high-speed FIFO is used to safely carry out the transition from the first clock domain to the second clock domain. Therein, the high-speed FIFO has to synchronize the two different clock domains and therefore includes a plurality of flip-flops which are operated at the high clock frequency of the first clock domain which will cause an issue due to the increase in power consumption. In addition, the high-speed FIFO will add latency to the receive path which would be a critical issue, e.g., for a DRAM product. Furthermore, the FIFO would have to operate at two different frequencies at the boundary between the two internal clock domains, thus requiring costly internal clock and clock-phase generation circuits.

In another approach, the serial high-speed data is latched in a pointer from which the data bits of a data frame is transferred to a barrel shifter which is clocked by the second lower frequency clock of the second clock domain. Therein, the transferring of the data frame bits to the barrel shifter is critical in timing as the setup and hold times of the pointer and the first high-speed clock domain has to be met.

SUMMARY OF THE INVENTION

It is an object of the present invention to provide a data handover unit for securely handing over serial high-speed data from a first to a second clock domain wherein the disadvantages of the prior art are avoided. In particular, an embodiment provides a data handover unit having a reduced power consumption and wherein timing issues are less challenging.

Moreover, it is an object of the present invention to provide a method for operating a data handover unit.

According to a first aspect of the present invention a data handover unit for transferring data from a first clock domain to a second clock domain is provided. The data handover unit includes a first clock unit operable to supply a first clock signal, a selector stage operable to sample an incoming data stream with regard to the first clock signal, a second clock unit operable to supply a second clock signal, a storage unit coupled with the selector stage wherein the storage unit has a first plurality of storage elements each of which is operable to store one bit of data of the sampled data stream, and an output unit for parallelly reading out a set of data from a second plurality of storage elements included in the first plurality of storage elements with regard to the second clock signal. The selector stage is further operable to successively write the data bits of the sampled data stream into the first plurality of storage elements and to store the respective data bits of the sampled data stream in the respective storage elements until they were read out by the output unit.

One advantage of the data handover unit of the present invention is that a data transferring using a high-speed FIFO and/or between input pointers and barrel shifters can be omitted, thereby avoiding critical timing conditions while operating the data handover unit. One idea of the present invention is to use a single storage unit wherein it is assured that incoming data bits are stored in the storage elements of the storage units until they have been read out. Furthermore, it may be achieved that both frequency and phase of the incoming high speed data can be simultaneously transferred from the first to the second clock domain.

According to a preferred embodiment of the present invention, the storage unit is configured as a ring register wherein each of the storage elements is cyclically overwritten by the sampled bit of the incoming data stream. Thus, the number of storage elements used for latching in the data bits of the incoming data stream can be limited in number such that a reduced power consumption can be realized.

Preferably, a position counter is provided which is operable to provide a position data to the output unit wherein the output unit is operable to determine the position of the second plurality of storage elements within the first plurality of storage elements depending on the position data.

According to another embodiment of the present invention, the first plurality of storage elements is at least twice in number compared to the second plurality of storage elements.

Furthermore, a first clock domain has a first data rate frequency which is higher than the second data rate frequency of the second clock domain.

Moreover, a multiplication factor between the first data rate frequency and the second data rate frequency is not an integer. Preferably, a multiplication factor of the first data rate frequency and the second data rate frequency differs from multiples of 2.

According to another aspect of the present invention, a data handover unit for transferring data from a first clock domain to a second clock domain is provided. The data handover unit includes a first clock unit operable to supply first clock signals each having a first clock frequency, wherein the first clock signals each have a predetermined phase shift with regard to the other first clock signals, a selector stage including a plurality of selector circuits each operable to sample the incoming data stream with regard to a respective one of the first clock signals, a second clock unit operable to supply a second clock signal, a storage unit comprising a first plurality of storage elements, wherein each of the storage elements is operable to store one data bit of the sampled data substreams, wherein the plurality of storage elements are configured in a plurality of storage element groups, each of the storage element groups is associated to one of the data substreams such that the respective data substream is latched into the storage elements of the respective storage element group. The data handover unit further includes an output unit for parallelly reading out a set of data bits from a second plurality of storage elements included in the first number of storage elements with regard to the second clock signal, wherein the selector circuits are further operable to successively write the data bits of the respective sampled data substreams into the storage elements of the respective storage element group and to keep stored the respective data bits of the sampled data substream in the respective storage elements at least until they were read out by the output unit.

One advantage of a data handover unit having the incoming data stream sampled with a plurality of first clock signals to obtain a number of sampled data substreams is that the sampled data substreams are provided in a reduced frequency with respect to the frequency of the first clock signal such that the timing requirement are less critical. This results in that the storage unit which is provided for storing the sampled data stream is less challenging in design.

According to a preferred embodiment of the present invention, each of the storage element groups is configured as a ring register, wherein, in each of the ring registers, each of the storage elements is cyclically overwritten by the data bits of the sampled data substream.

Preferably, a position counter is provided which is operable to provide a position data to the output unit wherein the output unit is operable to determine the position of the second plurality of storage elements within the first plurality of storage elements depending on the position data.

The output unit may further comprise a bit locator which is configured such that, depending on the position data, the second plurality of storage elements is selected from the first plurality of storage elements.

According to another embodiment of the present invention, the first plurality of storage elements is at least twice in number compared to the second plurality of storage elements. Thereby, it can be assured that a frame of data bits is read out before the second plurality of storage elements, in which the frame of the data bits is stored, is cyclically overwritten by the data bits of the sampled data substream.

Preferably, the first clock domain has a first data rate frequency which is higher than the second data rate frequency of the second clock domain. A multiplication factor may be provided between the first data rate frequency and the second data rate frequency which is not an integer. In particular, a multiplication factor can be provided which differs from multiples of 2.

According to another aspect of the present invention, a method for operating a data handover unit for transferring data from a first clock domain to a second clock domain is provided. The method comprises the steps of receiving an incoming data stream synchronized to a first clock signal, sampling the incoming data stream with regard to the first clock signal, successively storing data bits of the sampled data stream in a first plurality of storage elements with respect to the first clock signal and parallelly reading out a frame of data bits from a second plurality of storage elements included in the first plurality of storage elements with regard to the second clock signal, wherein the respective data bits of the sampled data stream are kept stored in the respective storage elements until they were read out by the step of parallelly reading out the frame of data bits.

Preferably, each of the first plurality of storage elements is cyclically overwritten by a sampled data bit of the incoming data stream.

According to a preferred embodiment of the present invention, the method further comprises the steps of providing a position data depending on the second clock signal and determining a second plurality of storage elements within the first number of storage elements depending on the position data.

According to another aspect of the present invention, a method for operating a data handover unit for transferring data from a first clock domain to a second clock domain is provided. The method comprises the steps of providing a plurality of first clock signals each having a first clock frequency, wherein the first clock signals each have a predetermined phase shift with regard to the other first clock signals, sampling the incoming data stream with regard to a respective one of the first clock signals to obtain a respective sampled data substream, providing a second clock signal, storing the data bits of each of the sampled data substreams in a first plurality of storage elements, and of parallelly reading out a frame of data bits from a second plurality of storage elements included in the first plurality of storage elements with regard to the second clock signal. The data bits of the respective sampled data substreams are successively written into storage element groups each associated to one of the data substreams, wherein the respective data bits of the sampled data substream are kept stored in the storage elements of the respective storage element groups at least until they were read out.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
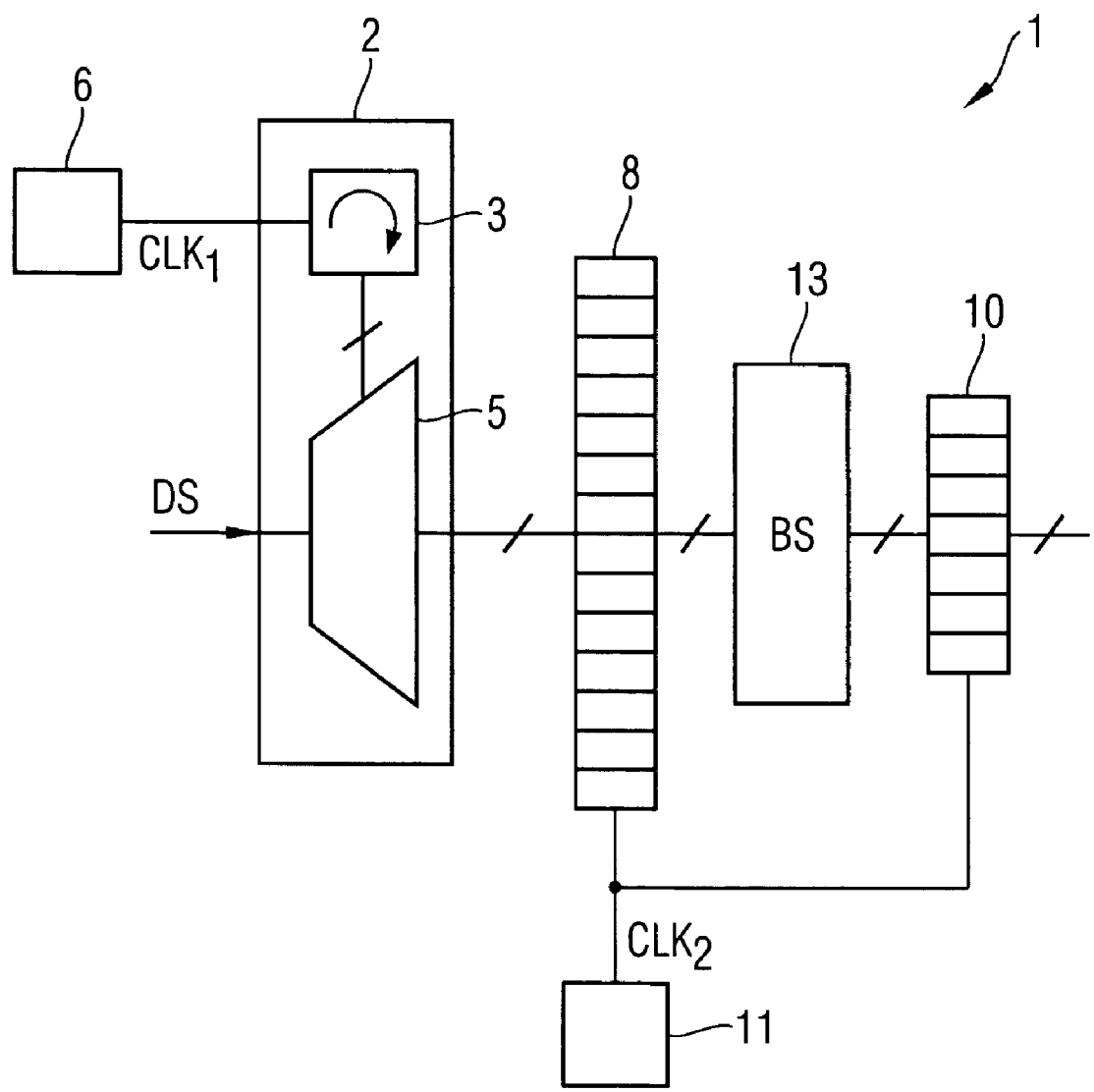
FIG. 1 shows a block diagram of a data handover unit according to a first embodiment of the present invention.
Figure 2:
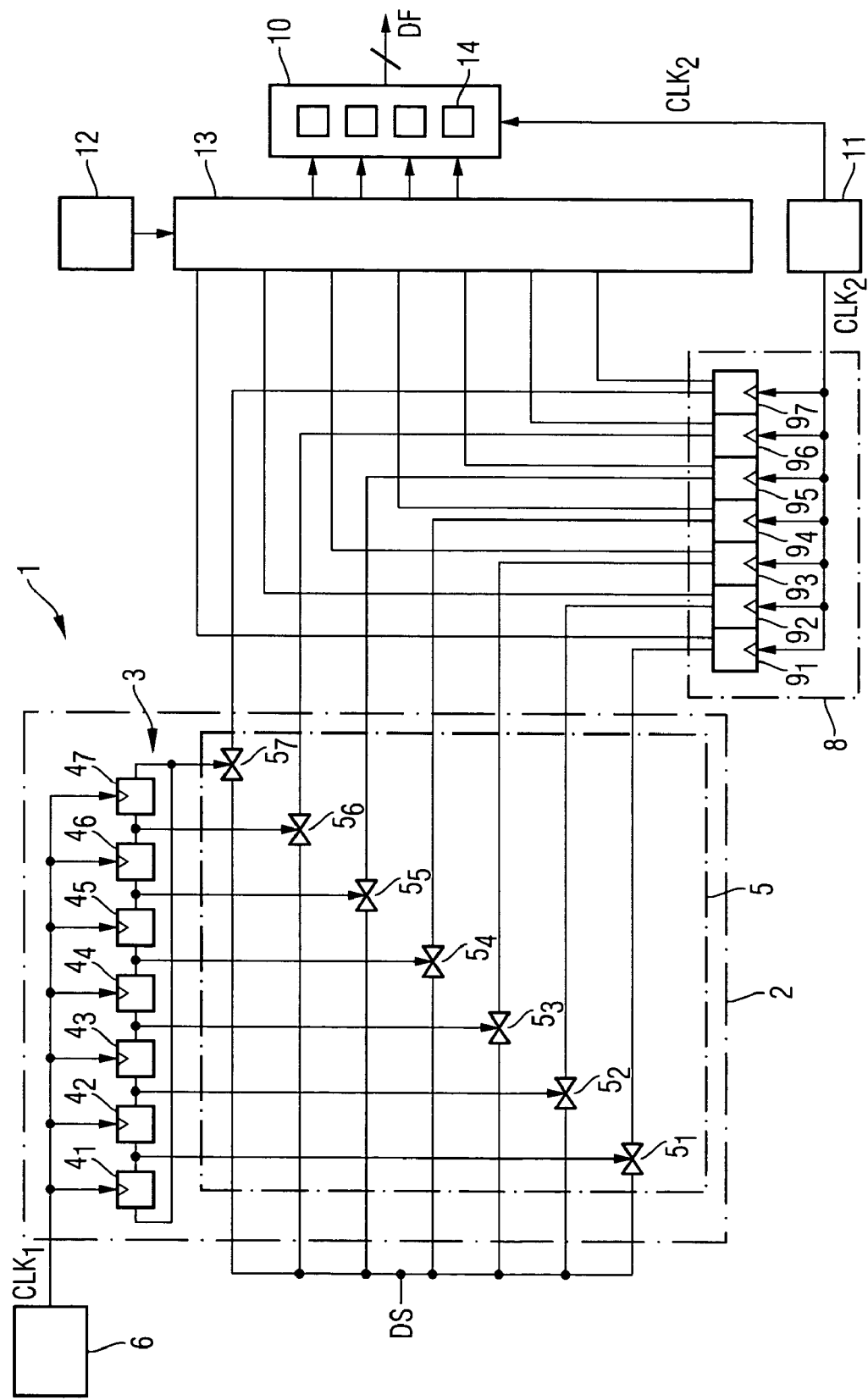
FIG. 2 shows a more detailed block diagram of the data handover unit of FIG. 1.

FIGS. 1 and 2 show schematically a data handover unit 1 in which an incoming data stream DS which is synchronized with regard to a first clock signal $CLK_1$ is parallelized to obtain data frames including a predetermined number of data bits which are output with regard to a second clock signal $CLK_2$. In detail, the data handover unit 1 comprises a selector stage 2 having a pointer 3 in the form of a pointer which is feedback coupled such that a ring register is formed. The pointer 3 comprises a series of register cells $4_1$-$4_7$ an output of which is coupled to an input of a next register cell $4_1$-$4_7$ of the pointer 3, respectively, wherein a last of the register cells $4_7$ of the pointer 3 is coupled to an input of a first register cell of the pointer 3.

The pointer 3 is coupled with a selector 5 to select a storage element $9_1$-$9_7$ of a storage unit 8 for receiving the incoming data streams DS. In detail, the outputs of the register cells $4_1$-$4_7$ of the pointer 3 are each coupled to a respective switch $5_1$-$5_7$ such that a data applied on the output of a respective one of the register cells 4 is coupled to a control input of one of the switches $5_1$-$5_7$, respectively. The pointer 3 is clocked by the first clock signal $CLK_1$ which is supplied by a first clock unit 6. The first clock signal $CLK_1$ may also be provided in conjunction with the incoming data stream generated thereof, or may be provided externally of the data handover unit. In any case, the first clock signal $CLK_1$ has a frequency which is synchronized to the data rate/frequency of the incoming data stream DS. The first clock signal $CLK_1$ is applied to the pointer 3 which is initially loaded with a single "1" which is shifted to a next of the register cells 4 when a next valid edge (level transition) of the first clock signal arrives at the pointer 3. Thereby, a pointer circuit can be realized.

In the given example, the pointer 3 includes seven (7) register cells $4_1$-$4_7$ each of which is connected to a control input of a respective switch $5_1$-$5_7$. Each of the switches $5_1$-$5_7$ has a first terminal which is operable to receive the data stream and a second terminal which is connected to a storage unit 8. The switches $5_1$-$5_7$ are configured such that, depending on the control unit, a respective switch is closed or opened, wherein in the given example the respective switch $5_1$-$5_7$ is closed if a logical "1" is applied by the respective register cell $4_1$-$4_7$. Thus, the selector stage 2 is substantially operable to sample the incoming data stream DS with regard to the first clock signal and to successively write the data bits of the sampled data stream into the storage unit 8.

The storage unit 8 comprises the storage elements $9_1$-$9_7$ each associated to one of the switches $5_1$-$5_7$. The storage elements 9 are operable to latch in a data bit applied via the respective switch $5_1$-$5_7$ if the respective switch $5_1$-$5_7$ is closed such that the data of the incoming data stream is applied on the storage element 9. A switch $5_1$-$5_7$ which is opened, cuts the data of the data stream DS from the respective storage element $9_1$-$9_7$ such that the content of the respective storage element 9 is not changed. As in the pointer 3, one register cell $4_1$-$4_7$ after the other outputs a logical "1", the data stream is sampled in the associated switch $5_1$-$5_7$ such that on the respective storage element $9_1$-$9_7$ the sampled data bit of the data stream is latched in. As the pointer 3 is configured as a ring register the data in the storage element $9_1$-$9_7$ is kept stored until it is overwritten again. In the given example, this occurs every seven (7) clock cycles (or seven valid edges, respectively) of the first clock signal $CLK_1$. Consequently, a sampled data bit of the data stream is kept stored in the storage unit 8 for a time period which equals seven times the period of the first clock signal (or seven active edges). In case that a falling and rising edge of the first clock signal shifts the contents of the register cells 4 of the pointers 3, the time period for which the respective data bit is stored in the storage unit 8 equals 3.5 times the clock period of the first clock signal $CLK_1$.

Furthermore, an output stage 10 is provided which supplies the data frame DF having a second plurality of data bits as an output of the data handover unit 1 with regard to a second clock signal $CLK_2$. The second clock signal $CLK_2$ is provided by a second clock unit 11. The frequency of the second clock signal $CLK_2$ is lower than the frequency of the first clock signal wherein the multiplication factor between the frequency of the first clock signal and the frequency of the second clock signal is less than the number of the storage elements (seven in the given example), preferably less than half of the number of storage elements $9_1$-$9_7$ in the storage unit 8. This assures that all data bits associated to one data frame to be output can be simultaneously stored within the storage elements 9 such that the content of the storage elements 9 can be simultaneously latched into the output unit 10 to provide the data frame as an output which is synchronized to the second clock signal $CLK_2$.

For determining in which of the first plurality of storage elements 9 the data frame is located, a position counter 12 is provided which is operable to supply a position data to a barrel shifter 13 (also referred to as a bit locator) depending on the second clock signal $CLK_2$. The barrel shifter 13 is connected between the storage unit 8 and the output stage 10. Barrel shifter 13 and output stage 10 are also referred to as an output unit. The barrel shifter 13 selects the respective storage elements 9 which contain the current data frame depending on the position data and forward the respective data bits to the output stage 10.

The output stage 10 may comprise output latches 14 in which the data of the register elements $9_1$-$9_7$ is latched to avoid an access conflict in the register elements $9_1$-$9_7$ when the sampled data bit is written in the respective register element $9_1$-$9_7$ which is simultaneously read out which may lead to an indefinite state of the respective data bit at the output of the data handover unit. If it is assured by design that no concurrent access on one of the storage elements $9_1$-$9_7$ occurs, the output latches 14 can be omitted and the storage elements $9_1$-$9_7$ selected by the barrel shifter 13 can be used instead.

The position counter 12 may be initialized in an initialization routine which may be carried out on startup and on a reset wherein the position counter 12 determines the first bit of a data frame to be output when a respective active edge of the second clock signal $CLK_2$ occurs.

One main idea of the present invention is to use a storage unit 8 in which data bits of an incoming data stream DS is successively written wherein the data frame to be output is read out from the storage elements $9_1$-$9_7$ with respect to the second clock signal $CLK_2$ before the respective storage elements $9_1$-$9_7$ are overwritten with a next data bit of the incoming data stream.

The output latches 14 of the output stage 10 are able to latch the data of the selected storage elements $9_1$-$9_7$ on every active edge of the second clock signal $CLK_2$ wherein the data bits of the data frame DF can be output via the output latches 14.

As the storage elements $9_1$-$9_7$ are cyclically overwritten after a time period which is determined by the time between the active edges of the first clock signal and the total number of storage elements in the storage unit 8. Thereby, it may be the case that the data bits of a date frame DF are split into a first portion including the last storage element and a second portion including the first storage element. By means of the barrel shifter 13, this separation of the data bits of the data frame is corrected by a selection depending on the position counter 12. Instead, a barrel rotator which locates the data bits of the data frame by rotating them on the predetermined position can also be used. As the frequency of the second clock signal $CLK_2$ is reduced with regard to the frequency of the first clock signal $CLK_2$, it is sufficient to operate the barrel rotator in a low-speed operation.

Figure 3:
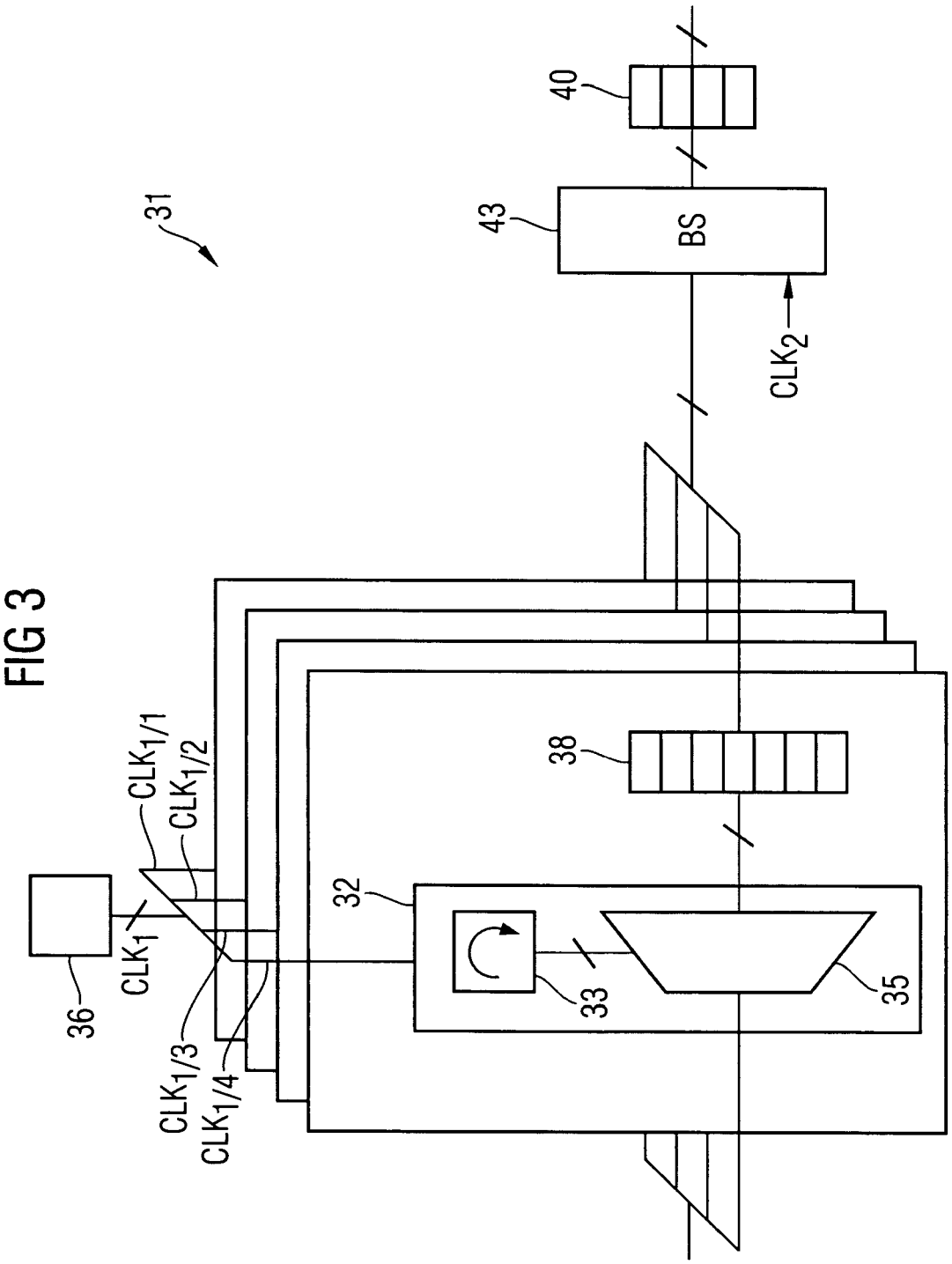
FIG. 3 shows a block diagram of a data handover unit according to a second embodiment of the present invention.
Figure 4:
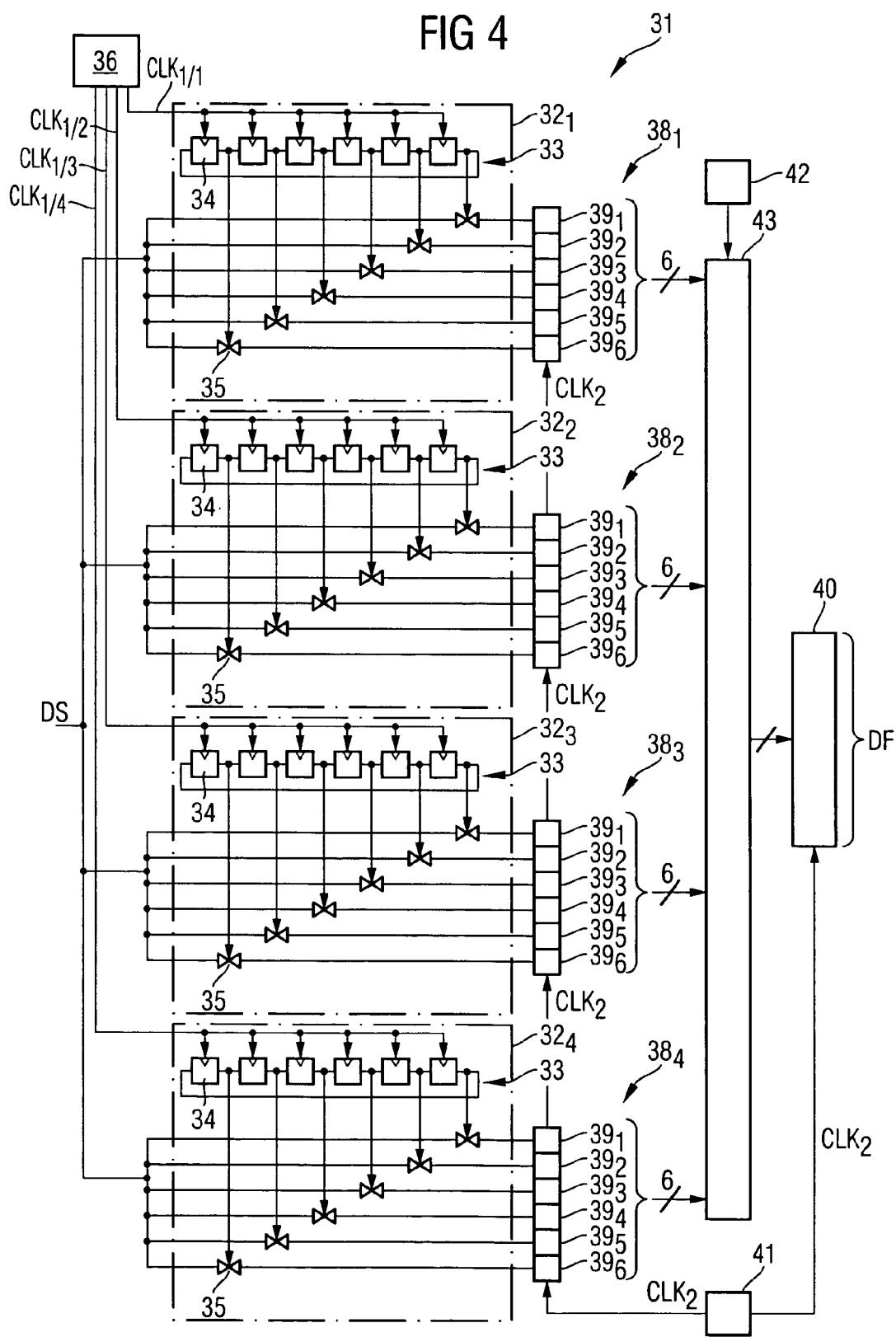
FIG. 4 shows a more detailed block diagram of the data handover unit of FIG. 3.

In FIGS. 3 and 4, a data handover unit 31 according to a further embodiment of the present invention is illustrated. The data handover unit 31 receives an incoming data stream DS which is sampled by means of four selector circuits $32_1$-$32_4$ which are clocked by first clock signals $CLK_{1/1-4}$ provided by a first clock unit 36 wherein the first clock signals $CLK_{1/1-4}$ have the same frequency and are phase shifted with respect to one another. In the case of four selector circuits 32, the phase shift between the first clock signals equals 360°/4=90°. Any other number of selector circuits 32 can be applied. As already described with regard to the embodiments of FIG. 1, each of the selector circuits $32_1$-$32_4$ comprises a pointer 33 in the form of a shift register including register cells 34 which are arranged to form a ring register. The outputs of the register cells 34 are coupled with a respective selector 35 having respective switches $35_n$ such that data bits of the respective data stream DS applied to the respective selector circuit $32_1$-$32_n$ is forwarded into a respective storage unit 38 and stored as a sampled data substream therein in a respective storage element $38_n$. As described with regard to the first embodiment, the pointers 33 are operated as a pointer which selects one of the switches $35_n$ to sample the incoming data stream and to forward the sampled data bit of the sampled data substream to an associated storage element 39 of the storage unit 38. In the given example, each of the storage units $38_1$ to $38_4$ comprises a six storage elements $39_1$-$39_6$ which are successively written with the current data bit sampled in the respective selector circuit $32_1$-$32_4$. As the data stream is applied to each of the selector circuits 32 and therein sampled with respect to a respective first clock signal $CLK_{1/1-4}$ having a predetermined phase relation to the other first clock signals $CLK_{1/1-4}$, successive data bits of the data stream are sampled in different selector circuits $32_1$ to $32_4$ and therefore written in respective storage elements 39 of the different storage units $38_1$ to $38_4$.

Each of the storage elements $39_n$ of each of the storage units $38_1$ to $38_n$ are coupled to an output stage 40 via a barrel shifter or a barrel rotator 43 such that the content of the storage elements 39 can be latched in the output stage 40. Barrel rotator 43 and output stage 40 are also referred to as an output unit. The content of the storage elements 39 is read out with regard to a second clock signal $CLK_2$ provided by a second clock unit 41. Within the clock period of the second clock signal $CLK_2$, the barrel rotator 43 selects the read-in data bits such that the data bits of the data frame which are to be output next are stored in a predetermined number of output latches of the output stage 40. The function of the barrel rotator 43 is supported by a position counter 42 which provides a position data or a data related thereto which allows to select the data bits of the data frame from the storage unit 39 and to forward them into the output latch to output the data frame.

As the second clock signal $CLK_2$ has a frequency which is lower than the frequency of the first clock signals $CLK_{1/1-4}$, a write operation from the selector circuits into the storage elements 39 of the respective storage units $38_1$ to $38_4$ and the reading out of data from the storage elements 39 via the barrel rotator 43 may occur simultaneously, thereby resulting in an indefinite state of the respective storage element. However, as the position counter 42 defines a position of a data frame which has already been sampled and which has not yet been overwritten by one or more successive data bit, the data bits of the data frame can correctly be forwarded by the barrel rotator 43 such that no data loss occurs.

Figure 5:
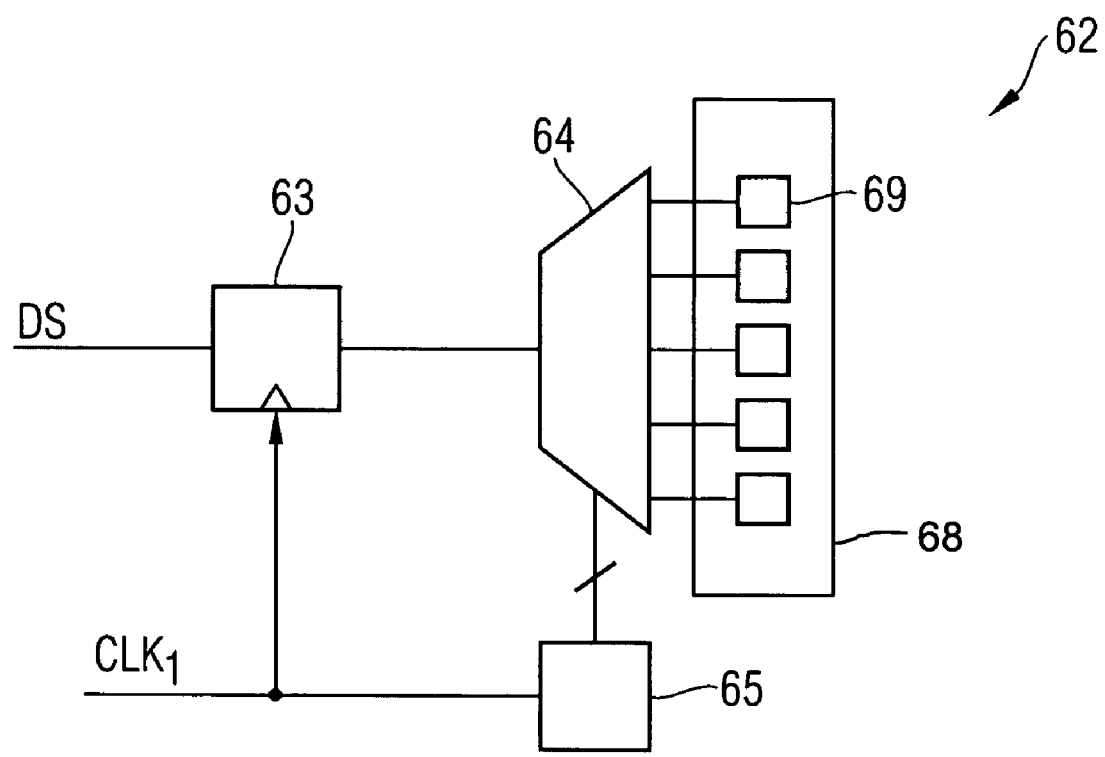
FIG. 5 shows a block diagram of a data handover unit according to a third embodiment of the present invention.

In FIG. 5, an alternative selector circuit 62 is shown which may replace the selector circuit of the embodiments mentioned above. The selector circuit 62 comprises a sampling latch 63 in which the incoming data stream DS is latched with respect to the first clock signal CLK1 provided by a first clock unit or from an external source as described above. The latched-in data bit is provided to a demultiplexer unit 64 which is coupled with a pointer unit 65 which counts the active edges of the first clock signal. Depending on a pointer value the latched-in data bit is forwarded to a respective storage element 69 of a storage unit 68. The pointer unit 65 is operable to successively generate a pointer value such that the data bit is successively written into the storage elements 69 wherein each of the storage elements 69 is cyclically overwritten by the latched-in data bit. The cycle thereof depends on the number of storage elements which are provided in the storage unit 68.

One idea of the present invention is to sample an incoming data stream with regard to a high frequency first clock signal and to latch in the sampled data bit in storage elements which are successively written and cyclically overwritten by following incoming data bit, wherein, in the meantime between writing a data bit and overwriting the data bit by a next data bit, the respective storage elements are latched into a barrel shifter as they are or according to a predefined scheme such that the barrel rotator is able to extract the data bits of the data frame to be output by means of a position counter and the like.

Thereby, a robust timing for the storage element can be guaranteed that will carry the actually needed data bits of the frame to be output.

While the foregoing is directed to embodiments of the present invention, other and further embodiments of the invention may be devised without departing from the basic scope thereof, and the scope thereof is determined by the claims that follow.

What is claimed is:

1. A data handover unit for transferring data from a first clock domain to a second clock domain, comprising:
   a first clock unit for supplying a first clock signal;
   a selector stage for sampling an incoming data stream with regard to the first clock signal;
   a second clock unit for supplying a second clock signal;
   a storage unit coupled with the selector stage, wherein the storage unit has a first plurality of storage elements, each of which is configured to store one bit of data of the sampled data stream; and
   an output unit for parallelly reading out a frame of data from a second plurality of storage elements within the first plurality of the storage elements with respect to the second clock signal,
   wherein the selector stage is configured to successively write the data bits of the sampled data stream into the first plurality of storage elements and wherein the respective data bits of the sampled data stream are stored in the respective storage elements at least until read out by the output unit.

2. The handover unit of claim 1, wherein the storage unit is configured as a ring register and wherein each of the storage elements is cyclically overwritten by respective sampled data bits of the incoming data stream.

3. The handover unit of claim 2, further comprising:
   a position counter for providing a position data to the output unit, wherein the output unit is configured to determine a position of the second plurality of storage elements within the first plurality of storage elements depending on the position data.

4. The handover unit of claim 3, wherein the first plurality of storage elements is at least twice in number as the second plurality of storage elements.

5. The handover unit of claim 1, wherein the first clock domain has a first data rate frequency which is higher than a second data rate frequency of the second clock domain.

6. The handover unit of claim 5, wherein a multiplication factor between the first data rate frequency and the second data rate frequency is not an integer.

7. The handover unit of claim 6, wherein the multiplication factor between the first data rate frequency and the second data rate frequency differs from multiples of 2.

8. A data handover unit for transferring data from a first clock domain to a second clock domain, comprising:
   a first clock unit configured to supply first clock signals each having a first clock frequency, wherein the first clock signals each have a predetermined phase shift with regard to the other first clock signals;
   a selector stage including a plurality of selector circuits, wherein each selector circuit is configured to sample an incoming data stream with respect to a respective one of the first clock signals to obtain a respective sampled data substream;
   a second clock unit configured to supply a second clock signal;
   a storage unit comprising a first plurality of storage elements, wherein each storage element is configured to store one data bit of the sampled data substreams, wherein the first plurality of storage elements are configured in a plurality of storage element groups, wherein each storage element group is associated to one of the sampled data substreams such that the respective sampled data substream is latched into the storage elements of the respective storage element group; and
   an output unit for parallelly reading out a frame of data bits from a second plurality of storage elements within the first plurality of storage elements, with respect to the second clock signal,
   wherein the selector circuits are further configured to successively write the data bits of the respective sampled data substreams into the storage elements of the respective storage element group and wherein the respective data bits of the sampled data substream are stored in the respective storage elements at least until read out by the output unit.

9. The handover unit of claim 8, wherein each storage element group is configured as a ring register, and wherein in each ring register, each of the storage elements is cyclically overwritten by the data bits of the sampled data substream.

10. The handover unit of claim 9, further comprising:
a position counter configured to provide a position data to the output unit, wherein the output unit is configured to determine a position of the second plurality of storage elements within the first plurality of storage elements depending on the position data.

11. The handover unit of claim 10, wherein the output unit further comprises a bit locator which is configured such that, depending on the position data, the second plurality of storage elements is selected from the first plurality of storage elements.

12. The handover unit of claim 9, wherein the first plurality of storage elements is at least twice in number as the second plurality of storage elements.

13. The handover unit of claim 8, wherein the first plurality of storage elements is at least twice in number as the second plurality of storage elements.

14. The handover unit of claim 13, wherein a multiplication factor between the first data rate frequency and the second data rate frequency is not an integer.

15. The handover unit of claim 14, wherein the multiplication factor between the frequency of the first clock signal plurality and the frequency of the second clock signal differs from multiples of 2.

16. A method for operating a data handover unit for transferring data from a first clock domain to a second clock domain, the method comprising:
receiving an incoming data stream synchronized to a first clock signal;
sampling the incoming data stream with respect to the first clock signal;
successively storing data bits of the sampled data stream in a first plurality of storage elements with respect to the first clock signal; and
parallelly reading out a frame of data bits from a second plurality of storage elements within the first plurality of the storage elements with respect to the second clock signal, wherein the respective data bits of the sampled data stream are kept stored in the respective storage elements at least until read out parallelly as the frame of data bits.

17. The method of claim 16, wherein each of the first plurality of the storage elements is cyclically overwritten by the sampled data bit of the incoming data stream.

18. The method of claim 17, further comprising: the steps of:
providing a position data depending on the second clock signal; and
determining a position of the second plurality of storage elements within the first plurality of storage elements depending on the position data.

19. The method of claim 18, wherein the first plurality of storage elements is at least twice in number as the second plurality of storage elements.

20. The method of claim 16, wherein the first clock domain has a first data rate frequency which is higher than a second data rate frequency of the second clock domain.

21. The method of claim 20, wherein a multiplication factor between the first data rate frequency and the second data rate frequency is not an integer.

22. The Method of claim 21, wherein the multiplication factor between the first data rate frequency and the second data rate frequency differs from multiples of 2.

23. A method for operating a data handover unit for transferring data from a first clock domain to a second clock domain, comprising:
providing a plurality of first clock signals each having a first clock frequency, wherein the first clock signals each have a predetermined phase shift with respect to the other first clock signals;
sampling the incoming data stream with respect to one of the first clock signals to obtain a respective sampled data substream;
providing a second clock signal;
storing data bits of each respective sampled data substreams in a first plurality of storage elements; and
parallelly reading out a frame of data bits from a second plurality of storage elements within the first plurality of storage elements, with respect to the second clock signal;
wherein the data bits of the respective sampled data substreams are successively written into storage element groups, wherein each storage element group is respectively associated to one of the sampled data substreams; and
wherein the respective data bits of the sampled data substream are stored in the storage elements of the respective storage element groups at least until read out.

24. The method of claim 23, wherein each of the storage elements of each storage element group is cyclically overwritten by the sampled data bits of the respective incoming data substream.

25. The method of claim 24, further comprising:
providing a position data depending on the second clock signal;
determining a position of the second plurality of storage elements within the first plurality of storage elements depending on the position data.

26. The method of claim 25, wherein, depending on the position data, the second plurality of storage elements is selected from the first plurality of storage elements for parallel read out.

27. The method of claim 23, wherein the first plurality of storage elements is at least twice in number as the second plurality of storage elements.

28. The method of claim 23, wherein the first clock domain has a first data rate frequency which is higher than a second data rate frequency of the second clock domain.

29. The method of claim 28, wherein a multiplication factor between the first clock data rate frequency and the second data rate frequency is not an integer.

30. The method of claim 29, wherein the multiplication factor between the first data rate frequency and the second data rate frequency differs from multiples of 2.

* * * * *